United States Patent
Cui

(10) Patent No.: US 10,338,708 B2
(45) Date of Patent: Jul. 2, 2019

(54) FLEXIBLE TOUCH SCREEN, METHOD FOR MANUFACTURING THE SAME AND TOUCH DEVICE

(71) Applicant: Wuhan China Star Optoelectronics Technology Co., Ltd., Wuhan, Hubei (CN)

(72) Inventor: Lei Cui, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 88 days.

(21) Appl. No.: 15/325,291

(22) PCT Filed: Dec. 1, 2016

(86) PCT No.: PCT/CN2016/108188
§ 371 (c)(1),
(2) Date: Jan. 10, 2017

(87) PCT Pub. No.: WO2018/072266
PCT Pub. Date: Apr. 26, 2018

(65) Prior Publication Data
US 2018/0217691 A1 Aug. 2, 2018

(30) Foreign Application Priority Data
Oct. 19, 2016 (CN) .......................... 2016 1 0910445

(51) Int. Cl.
*G06F 3/041* (2006.01)
*H01L 27/12* (2006.01)
(Continued)

(52) U.S. Cl.
CPC .......... *G06F 3/041* (2013.01); *H01L 27/1218* (2013.01); *H01L 27/1248* (2013.01);
(Continued)

(58) Field of Classification Search
CPC . G06F 2203/04102; G06F 2203/04103; G06F 3/041
See application file for complete search history.

(56) References Cited

U.S. PATENT DOCUMENTS

2017/0249465 A1* 8/2017 Tsirkin ................ G06F 9/45558
2017/0285779 A1* 10/2017 Ryu ........................ G06F 3/041

* cited by examiner

*Primary Examiner* — Chun-Nan Lin
(74) *Attorney, Agent, or Firm* — Mark M. Friedman

(57) ABSTRACT

A flexible touch screen includes a flexible substrate having a main outer lead bonding area and a touch lead bonding area provided with flexible-printed-circuit-board bonding pads; and a touch control panel connected to the flexible substrate via an adhesive layer. The touch control panel has a surface facing the flexible substrate and having a touch-control flexible circuit board mounted thereon. The touch-control flexible circuit board corresponds to the touch lead bonding area in position. In bonding of flexible circuit boards, the touch-control flexible circuit board of the touch control panel is bonded to the flexible-printed-circuit-board bonding pads in the touch lead bonding area; the flexible substrate is bonded to a main flexible circuit board via the flexible-printed-circuit-board bonding pads in the main outer lead bonding area. The FPC bonding process for the flexible touch screen is simplified, and the number of FPC is reduced.

10 Claims, 3 Drawing Sheets

(51) Int. Cl.
*H05K 1/14* (2006.01)
*H05K 3/36* (2006.01)
*H05K 1/11* (2006.01)

(52) U.S. Cl.
CPC ............ *H05K 1/147* (2013.01); *H05K 3/361* (2013.01); *G06F 2203/04102* (2013.01); *G06F 2203/04103* (2013.01); *H05K 1/118* (2013.01); *H05K 2201/041* (2013.01); *H05K 2201/10128* (2013.01); *H05K 2201/10151* (2013.01); *H05K 2201/10166* (2013.01)

FLEXIBLE TOUCH SCREEN, METHOD FOR MANUFACTURING THE SAME AND TOUCH DEVICE

BACKGROUND OF THE INVENTION

Field of the Invention

The present invention relates to the technical field of display technology, and more particularly to a flexible touch screen, a method of manufacturing the same and a touch screen device that improve the OLB connection of a flexible substrate and a touch screen.

Description of the Related Art

The touch technology, as a simple, convenient and natural way for communication between humans and machines these days, has been highly valued in the world and widely used in all kinds of industry. With the development of technology and the increasing demand for high quality products, the flexible touch screen has been progressively used to mobile electronic devices, such as mobile phones and handheld computers. The flexible touch screen is a touch-control display panel which is made by flexible materials and is able to be bent into a deformed shape, thus having outstanding advantages of being light, thin, foldable and easy to carry.

Please refer to FIGS. 1 to 3, where FIG. 1 is a schematic view of a stacked structure of a conventional flexible touch screen; FIG. 2 is a schematic view of a bonding structure of a flexible circuit board of a conventional flexible touch screen; FIG. 3 is a schematic view of illustrating the bonding position of a flexible circuit board of a conventional touch screen. The flexible touch screen includes a TFT array substrate 11 and a touch control panel 12. The TFT array substrate 11 is connected to the touch control panel 12 via an adhesive layer 13. The TFT array substrate 11 has a thin-film encapsulation layer (TFE) 14 mounted thereon. A length of the touch control panel 12 is shorter than that of the TFT array substrate 11 so as to expose a first outer lead bonding (OLB) area 111 provided on the TFT array substrate 11. The touch control panel 12 has a second outer lead bonding area 121 on a top surface thereof. The TFT array substrate 11 is provided with a plurality of first bonding pads 112 on the first outer lead bonding area 111. The touch control panel 12 is provided with a plurality of second bonding pads 122 on the second outer lead bonding area 121. The TFT array substrate 11 is bonded to a main flexible circuit board 21 through the first bonding pads 112; the touch control panel 12 is bonded to the touch-control flexible circuit board 22 through the second bonding pads 122. The conventional flexible touch screen, in the bonding of flexible circuit boards, needs to firstly bond the touch flexible circuit board to the touch control panel, then further bond the touch flexible circuit board and the main flexible circuit board of the TFT array substrate together (as shown in FIG. 3, bonding position labeled with 31). Thus, the process for FPC bonding is complicated and requires a large number of needed FPC.

Therefore, the structure of the conventional flexible touch screen needs to be improved to enhance the integration property of the flexible touch screen, simplify the process of FPC bonding for the flexible touch screen and reduce the number of FPC.

SUMMARY OF THE INVENTION

An object of the present invention is to provide a touch screen, a method for manufacturing the same and a touch device having the same where the integration property of the flexible touch screen is enhanced, the process of FPC bonding for the flexible touch screen is simplified, and the number of FPC is reduced.

In order to achieve the foregoing object, the present invention provides a flexible touch screen including: a flexible substrate being provided with a main outer lead bonding area and a touch lead bonding area, wherein the main outer lead bonding area and the touch lead bonding area are both provided with flexible-printed-circuit-board bonding pads; the flexible substrate has a thin-film encapsulation layer mounted thereon; a touch control panel being connected to the flexible substrate via an adhesive layer; wherein the touch control panel has a surface facing the flexible substrate and provided with a touch-control flexible circuit board, wherein the position of the touch-control flexible circuit board corresponds to the position of the touch lead bonding area; the touch control panel includes a glass cover board, a touch-sensing film and a touch-control flexible circuit board; the touch-control flexible circuit board is embedded in the touch-sensing film; the touch-sensing film is connected to the flexible substrate via the adhesive layer; and in a bonding of flexible circuit boards, the touch-control flexible circuit board of the touch control panel is bonded to the flexible-printed-circuit-board bonding pads which are provided in the touch lead bonding area of the flexible substrate; the flexible substrate is bonded to a main flexible circuit board via the flexible-printed-circuit-board bonding pads which are provided in the main outer lead bonding area.

In order to achieve the foregoing object, the present invention provides a flexible touch screen including: a flexible substrate being provided with a main outer lead bonding area and a touch lead bonding area, wherein the main outer lead bonding area and the touch lead bonding area are both provided with flexible-printed-circuit-board bonding pads; a touch control panel being connected to the flexible substrate via an adhesive layer; wherein the touch control panel has a surface facing the flexible substrate and provided with a touch-control flexible circuit board, wherein the position of the touch-control flexible circuit board corresponds to the position of the touch lead bonding area; and in a bonding of flexible circuit boards, the touch-control flexible circuit board of the touch control panel is bonded to the flexible-printed-circuit-board bonding pads which are provided in the touch lead bonding area of the flexible substrate; the flexible substrate is bonded to a main flexible circuit board via the flexible-printed-circuit-board bonding pads which are provided in the main outer lead bonding area.

In order to achieve the foregoing object, the present invention further provides a touch device including the aforementioned flexible touch screen.

In order to achieve the foregoing object, the present invention further provides a method for manufacturing a flexible touch screen, which includes: providing a flexible substrate and depositing an adhesive layer on the flexible substrate; wherein the flexible substrate is provided with a main outer lead bonding area and a touch lead bonding area; providing a touch control panel so that the touch control panel is connected to the flexible substrate via the adhesive layer; the touch control panel has a surface facing the flexible substrate and provided with a touch-control flexible circuit board, wherein the position of the touch-control flexible circuit board corresponds to the position of the touch lead bonding area; in the touch lead bonding area, bonding the touch-control flexible circuit board to the flexible-printed-circuit-board bonding pads which are provided in touch lead bonding area; and in the main outer lead bonding area, bonding the flexible substrate to a main flexible circuit board via the flexible-printed-circuit-board bonding pads which are provided in the main outer lead bonding area.

The advantages of the present disclosure is that: by integrating the touch-control flexible circuit board of a flexible touch screen into the touch control panel and performing OLB (outer lead bonding) process of the touch control panel on the flexible substrate, the touch-control flexible circuit board of the touch control panel can be directly bonded to the corresponding OLB area on the flexible substrate. Therefore one step for FPC bonding is omitted, the process of FPC bonding for the flexible touch screen is simplified, and the number of FPC is reduced.

DETAILED DESCRIPTION OF THE PREFERRED EMBODIMENTS

With reference to the accompanying drawings and embodiments, the flexible touch screen, the method of manufacturing the same, and the touch device of the present invention are described in detail. Apparently, the embodiments in the following description are merely a part rather than all of the embodiments of the present invention. All other embodiments obtained by persons of ordinary skill in the art based on the embodiments of the present invention without creative efforts shall fall within the protection scope of the present invention.

Figure 1:
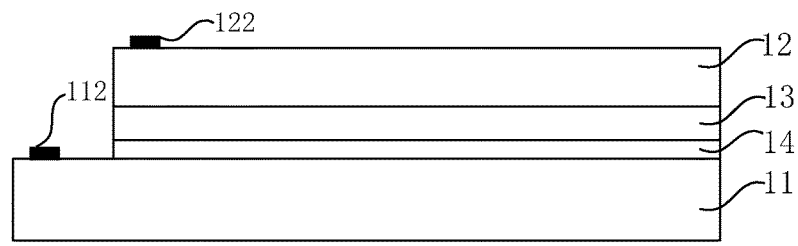
FIG. 1 is a schematic view of a stacked structure of a conventional flexible touch screen.
Figure 2:
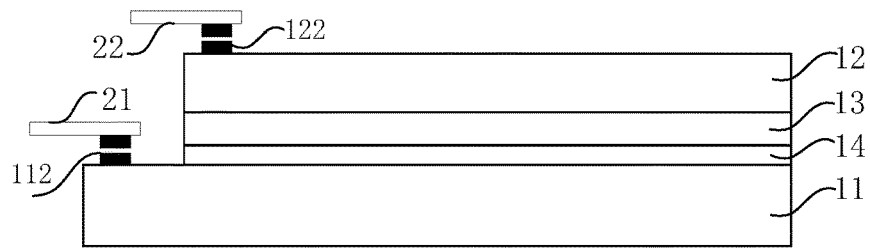
FIG. 2 is a schematic view of a bonding structure of a flexible circuit board of a conventional flexible touch screen.
Figure 3:
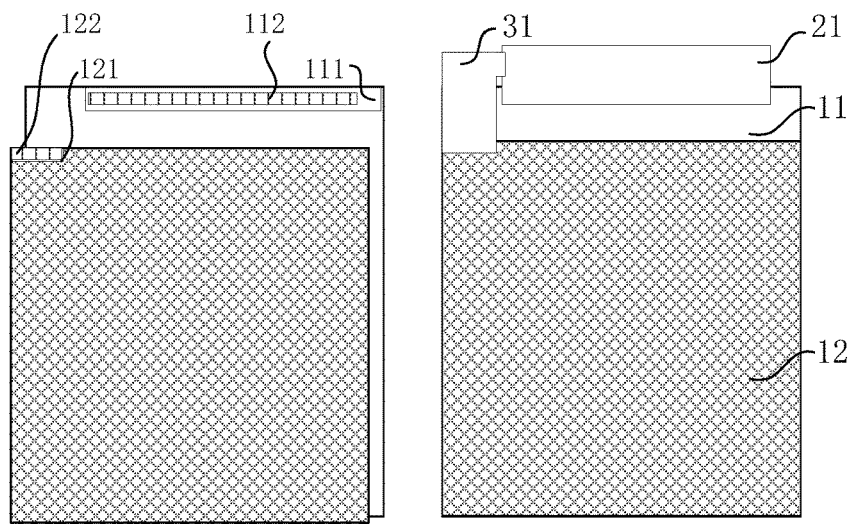
FIG. 3 is a schematic view of illustrating the bonding position of a flexible circuit board of a conventional touch screen.
Figure 4:
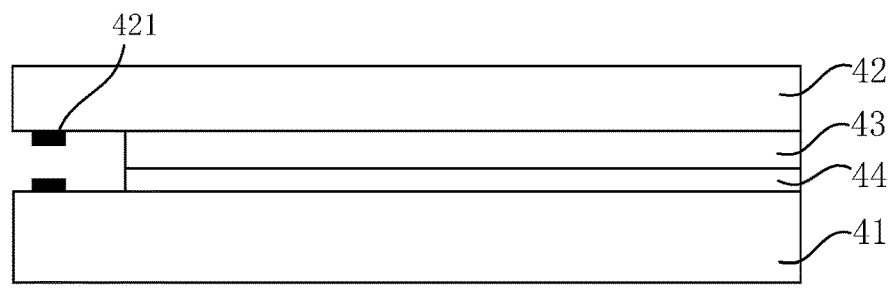
FIG. 4 is a schematic view of a stacked structure of a flexible touch screen according to a first preferred embodiment of the present invention.
Figure 5:
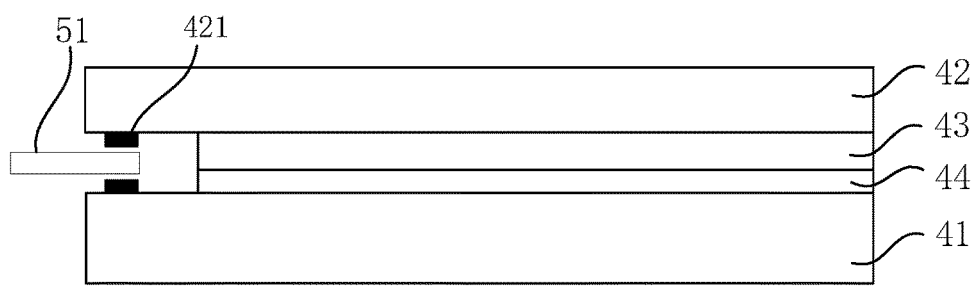
FIG. 5 is a schematic view of a bonding structure of a flexible circuit board of a flexible touch screen according to a preferred embodiment of the present invention.
Figure 6:
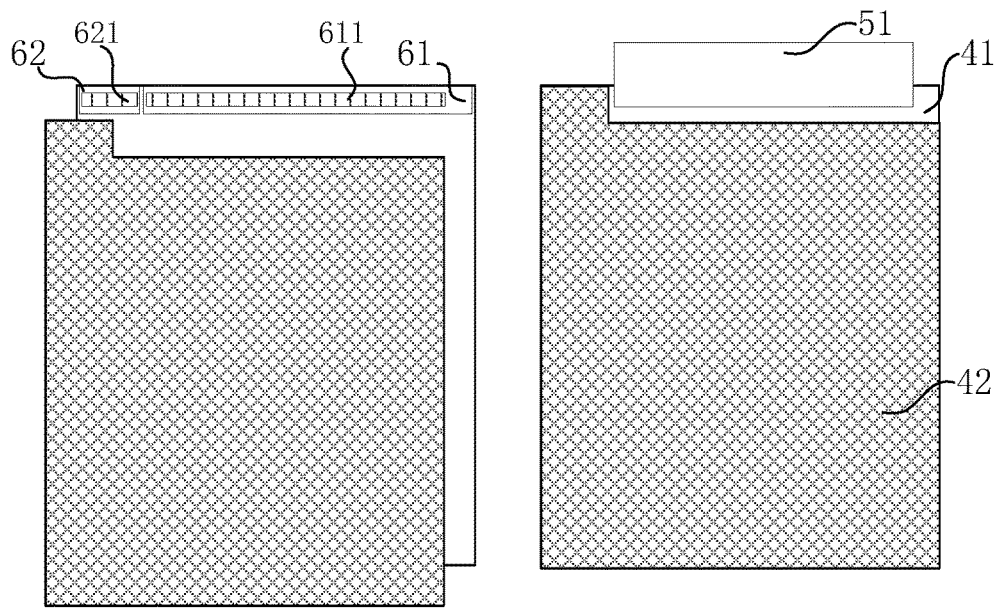
FIG. 6 is a schematic view of illustrating the bonding position of a flexible circuit board of a conventional touch screen according to a preferred embodiment of the present invention.

Please refer to FIGS. 4 to 6, where FIG. 4 is a schematic view of a stacked structure of a flexible touch screen according to a first preferred embodiment of the present invention; FIG. 5 is a schematic view of a bonding structure of a flexible circuit board of a flexible touch screen according to a preferred embodiment of the present invention; and FIG. 6 is a schematic view of illustrating the bonding position of a flexible circuit board of a conventional touch screen according to a preferred embodiment of the present invention. The flexible touch screen includes a flexible substrate 41 and a touch control panel 42.

The flexible substrate 41 is provided with a main outer lead bonding area 61 and a touch lead bonding area 62. The main outer lead bonding area 61 and the touch lead bonding area 62 are both provided with flexible-printed-circuit-board bonding pads (FPC Bonding Pad). With reference to FIG. 6, the main outer lead bonding area 61 is provided with main flexible-printed-circuit-board bonding pads 611 (Main FPC Bonding Pad), and the touch lead bonding area 62 is provided with touch flexible-printed-circuit-board bonding pads 621 (TP FPC Bonding Pad). That is, in the technical solution of the present invention, the bonding pads of the touch-control flexible circuit board are embedded into the flexible substrate.

The touch control panel 42 is connected to the flexible substrate 41 via an adhesive layer 43. The touch control panel 42 has a surface facing the flexible substrate 41 and having a touch-control flexible circuit board 421 mounted thereon. The position of the touch-control flexible circuit board 421 corresponds to the position of the touch lead bonding area 62. With reference to FIG. 4, the touch-control flexible circuit board 421 is mounted on a bottom surface of the touch control panel 42 and faces the touch lead bonding area 62 of the flexible substrate 41. The adhesive layer 43, in specific, may be an optically clear adhesive layer (OCA). A length of the adhesive layer 43 is shorter than that of the flexible substrate 41 and that of the touch control panel 42, so as to expose touch-control flexible circuit board 421 on the bottom surface of the touch control panel 42 and the main outer lead bonding area 61 and the touch lead bonding area 62 of the flexible substrate 41. The length of the touch control panel 42 and the length of the flexible substrate 41 may be equal.

In a bonding of flexible circuit boards, the touch-control flexible circuit board 421 of the touch control panel 42 is bonded to the touch flexible-printed-circuit-board bonding pads 621 which are provided in the touch lead bonding area 62 of the flexible substrate 41; and the flexible substrate 42 is bonded to a main flexible circuit board 51 via the main flexible-printed-circuit-board bonding pads 611 which are provided in the main outer lead bonding area 61.

By integrating the touch-control flexible circuit board of a flexible touch screen into the touch control panel and performing OLB (outer lead bonding) process of the touch control panel on the flexible substrate, the present invention achieves that the touch-control flexible circuit board of the touch control panel can be directly bonded to the corresponding OLB area on the flexible substrate. Therefore, one step for FPC bonding is omitted, the process of FPC bonding for the flexible touch screen is simplified, and the number of FPC is reduced.

Optionally, the flexible substrate 41 is a flexible TFT (Thin Film Transistor) array substrate.

Preferably, the flexible substrate 41 has a thin-film encapsulation (TFE) layer 44 mounted thereon. A flexible panel using thin-film encapsulation technology is lighter and thinner while having a quality flexibility property.

Optionally, the touch control panel 42 includes a glass cover board, a touch-sensing film and a touch-control flexible circuit board. The touch-control flexible circuit board is embedded in the touch-sensing film. The touch-sensing film is connected to the flexible substrate 41 via the adhesive layer 43. The structure of the touch-sensing film may be a single-layered structure or a dual-layered structure. The single-layered structure or the dual-layered structure may be an electrical conductive pattern formed from electrical conductive material on an insulting film carrier or a glass carrier. The electrical conductive pattern may be formed by laser radiation, etching treatment or photolithography.

The present invention further provides a touch device which includes the foregoing flexible touch screen of the present invention. By integrating the touch-control flexible circuit board of a flexible touch screen into the touch control panel and performing OLB (outer lead bonding) process of the touch control panel on the flexible substrate, the touch device having the flexible touch screen of the present invention can achieve that the touch-control flexible circuit board of the touch control panel can be directly bonded to the corresponding OLB area on the flexible substrate. Therefore, one step for FPC bonding is omitted, the process of FPC bonding for the flexible touch screen is simplified, and the number of FPC is reduced.

Figure 7:
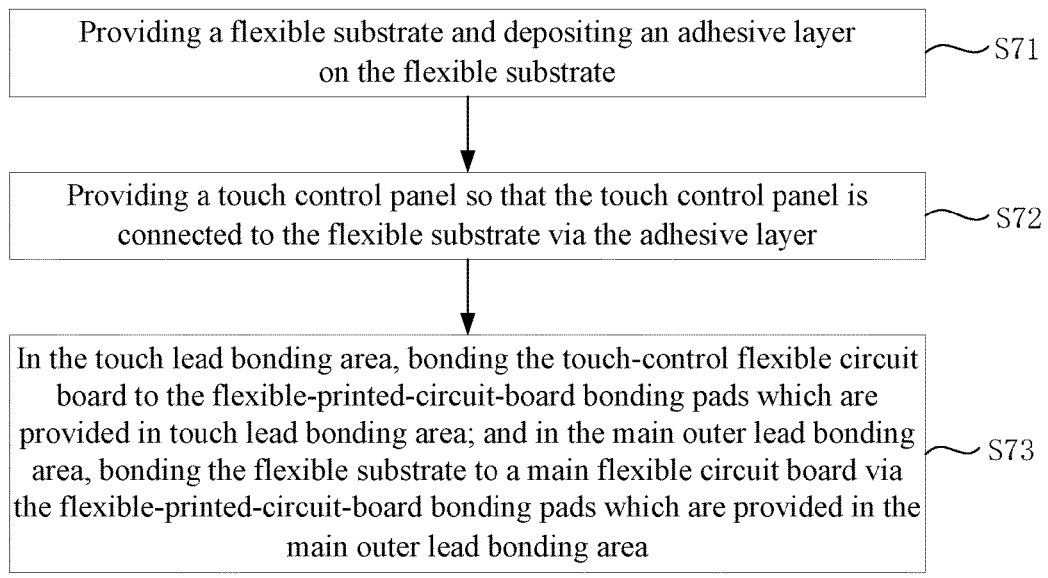
FIG. 7 is a flow chart of a method for manufacturing a flexible touch screen according to a preferred embodiment of the present invention.

Please refer to FIG. 7, FIG. 7 is a flow chart of a method for manufacturing a flexible touch screen according to a preferred embodiment of the present invention. The method includes the following steps: S71: providing a flexible substrate and depositing an adhesive layer on the flexible substrate; wherein the flexible substrate is provided with a main outer lead bonding area and a touch lead bonding area; S72: providing a touch control panel so that the touch control panel is connected to the flexible substrate via the adhesive layer; wherein the touch control panel has a surface facing the flexible substrate and provided with a touch-control flexible circuit board, wherein the position of the touch-control flexible circuit board corresponds to the position of the touch lead bonding area; S73: in the touch lead bonding area, bonding the touch-control flexible circuit board to the flexible-printed-circuit-board bonding pads which are provided in touch lead bonding area; and in the main outer lead bonding area, bonding the flexible substrate to a main flexible circuit board via the flexible-printed-circuit-board bonding pads which are provided in the main outer lead bonding area.

In conclusion, although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A flexible touch screen, comprising:
   a flexible substrate being provided with a main outer lead bonding area and a touch lead bonding area, wherein the main outer lead bonding area and the touch lead bonding area are both provided with flexible-printed-circuit-board bonding pads;
   wherein the main outer lead bonding area and the touch lead bonding area are different areas defined on a same surface of the flexible substrate;
   a touch control panel being connected to the flexible substrate via an adhesive layer; wherein the touch control panel has a bottom surface facing the flexible substrate and provided with a touch-control flexible circuit board, wherein the position of the touch-control flexible circuit board corresponds to the position of the touch lead bonding area; wherein the touch-control flexible circuit board is mounted on the bottom surface of the touch control panel and faces the touch lead bonding area of the flexible substrate;
   in a bonding of the touch-control flexible circuit board, the touch-control flexible circuit board of the touch control panel is bonded to the flexible-printed-circuit-board bonding pads which are provided in the touch lead bonding area of the flexible substrate; the flexible substrate is bonded to a main flexible circuit board via the flexible-printed-circuit-board bonding pads which are provided in the main outer lead bonding area.

2. The flexible touch screen as claimed in claim 1, wherein the flexible substrate is a flexible Thin-Film-Transistor (TFT) array substrate.

3. The flexible touch screen as claimed in claim 1, wherein the flexible substrate has a thin-film encapsulation layer mounted thereon.

4. The flexible touch screen as claimed in claim 1, wherein the touch control panel includes a glass cover board, a touch-sensing film and a touch-control flexible circuit board; the touch-control flexible circuit board is embedded in the touch-sensing film; the touch-sensing film is connected to the flexible substrate via the adhesive layer.

5. The flexible touch screen as claimed in claim 4, wherein the adhesive layer is an optically clear adhesive layer.

6. A touch device, comprising a flexible touch screen as claimed in claim 1.

7. The touch device as claimed in claim 6, wherein the flexible substrate is a flexible TFT array substrate.

8. The touch device as claimed in claim 6, wherein the flexible substrate has a thin-film encapsulation layer mounted thereon.

9. The touch device as claimed in claim 6, wherein the touch control panel includes a glass cover board, a touch-sensing film and a touch-control flexible circuit board; the touch-control flexible circuit board is embedded in the touch-sensing film; the touch-sensing film is connected to the flexible substrate via the adhesive layer.

10. The touch device as claimed in claim 9, wherein the adhesive layer is an optically clear adhesive layer.

* * * * *